United States Patent [19]
Cook

[11] Patent Number: 5,623,543
[45] Date of Patent: Apr. 22, 1997

[54] TWO PORT SIGNALLING VOLTAGES FILTER ARRANGEMENT

[75] Inventor: John W. Cook, Suffolk, England

[73] Assignee: British Telecommunications public limited company, London, England

[21] Appl. No.: 216,875

[22] Filed: Mar. 24, 1994

[30] Foreign Application Priority Data

Feb. 1, 1994 [EP] European Pat. Off. ............. 94300735

[51] Int. Cl.⁶ ............................... H04B 3/16; H04M 9/00
[52] U.S. Cl. ........................ 379/402; 379/398; 379/400
[58] Field of Search ................................. 379/402, 398, 379/400; 333/17, 217, 213; 330/107, 109

[56] References Cited

U.S. PATENT DOCUMENTS

| | | | |
|---|---|---|---|
| 3,828,281 | 8/1974 | Chambers, Jr. ........................... | 333/17 |
| 4,185,250 | 1/1980 | Regan ....................................... | 330/107 |
| 5,249,224 | 9/1993 | Chambers ................................. | 379/402 |
| 5,258,713 | 11/1993 | Rosch et al. .............................. | 379/398 |

OTHER PUBLICATIONS

CCITT Documents T1, E1.4/94 018 Jan. 12, 1994 Ken Hohhof. (pp. 2–5).
CCITT Documents T1, E1.4/94–018 dated Jan. 12, 1994.
"Study of the Feasibility and Advisability of Digital Subscriber Lines Operating at Rates Substantially in Excess of the Basis Access Rate" CCITT, T1E1.4, Aug. 18, 1992–152.

Primary Examiner—Thomas W. Brown
Assistant Examiner—Jacques M. Saint-Surin
Attorney, Agent, or Firm—Nixon & Vanderhye P.C.

[57] ABSTRACT

A twisted-pair telephone line is connected to a conventional telephone via a low-pass filter and equipment for receiving signals in an upper frequency range, e.g., 25–1000 kHz via a high-pass filter. The low-pass filter is primarily passive (to allow passage of line power, ringing and signalling voltages) but, to improve matching to non-resistive line and telephone impedances, at least the main part of the filter is flanked by impedance convertors in which amplifiers having an appropriate transfer function feed voltages back into the line via transformers through which power, ringing and dialing may pass unimpeded.

8 Claims, 5 Drawing Sheets

TWO PORT SIGNALLING VOLTAGES FILTER ARRANGEMENT

The present invention is concerned with filtering arrangements for use with telephone lines.

BACKGROUND OF THE INVENTION

One situation in which such filtering is required is that of asymmetric digital subscriber line (ADSL) technology. This is a means of providing broadband digital services at rates of typically 1.5 to 6Mbit/s over local loop lines; this high transmission rate being provided in one direction only (exchange to customer).

In order to maintain the attractiveness of this proposal it is important that ADSL is multiplexed on top of ordinary telephone services (POTS). This multiplexing is achieved by frequency division, using cross-over filters which have become known as ADSL/POTS separation filters. Similar filters are required at both the local exchange and customer ends of the line. In principle identical filters may be used but the requirements at the exchange end are somewhat relaxed so an optimised design may use slightly different filters. This document concentrates on the customer end filter which has the most challenging requirements, but the same problems are encountered with both filters.

Two particular aspects of telephone transmission systems require careful attention. One of these is the generation of massive transients, due to such activities as on/off hook switching, loop disconnect dialling, ring cadencing and ring trip. Of these probably the worst is ring trip which can generate transient peak voltages of some 100V. The second is the question of impedance balance.

In the UK (in common with many other parts of the world) non resistive frequency dependent impedances are used. The existing telephony access network infrastructure consists largely of twisted pairs of copper wires with polyethylene insulation, running from the local exchange to the customer's premises. The characteristic impedance $Z_0$ of such transmission lines is given by $$Z_0 = \sqrt{((R+jwL)/(G+jwC))}$$

where R, L, G and C are the series resistance, inductance, shunt conductance and capacitance per unit length of the line, w is the angular frequency and $j^2 = -1$.

Polyethylene is such a good insulator that G can be treated as zero whilst L (typically about 600 µH/km) is, at telephony frequencies up to 4 kHz, also negligible. Thus $Z_0$ can be approximated by $$Z_0 \approx \sqrt{(R/jwC)} = (1-j)\sqrt{(R/wC)}$$

Typical values for R and C are 170 Ω/km and 50 nF/km so that at 1 kHz $Z_0$ is approximately 520−j520 ohm.

In the access network telephony transmission is 2-wire, bidirectional, with separation of signals travelling in the two directions being achieved by bridges in the telephone and at the exchange. This situation is shown diagrammatically in FIG. 1. In a telephone 1, a microphone 2 is coupled via an amplifier 3 and an impedance 4 ($Z_c$ ohms) to a balun transformer 5 and hence the twisted-pair transmission line 6. The impedance 4 and the line impedance form one arm of the bridge, the other being formed by further impedances 7 and 8 of $Z_c$ and $Z_{so}$ respectively. A differential amplifier 9 is connected across the bridge circuit and feeds an earpiece 10. Similarly at the exchange, the bridge comprises impedances 14, 17, 18, balun 15 and amplifiers 13, 19, the input impedance being $Z_t$ and the impedance of the lower arm of the bridge $Z_b$.

It is apparent that the line 6 must present to the telephone 1 an impedance of $Z_{so}$ in order to balance the bridge in the telephone and prevent the user from hearing his own voice ("sidetone"). On a short line, $Z_t$ needs to equal $Z_{so}$ to achieve balance, and similarly $Z_c$ and $Z_{so}$ need to be equal for balance at the exchange.

For longer lines, the impedance presented by the line will remain unchanged only if $Z_t = Z_c = Z_0$ and thus to keep both bridges balanced independent of line length ideally $Z_c = Z_{so} = Z_t = Z_b = Z_0$.

For various reasons (such as historical precedent, compromise across a variety of pair types and the convenience of a resistive reference impedance) few if any operators have ended up with such a network strategy. Sometimes $Z_c$ and $Z_t$ are resistive (600, 900 or even 1200 Ohm) and $Z_b$, $Z_{so}$ chosen by compromise. In the UK all four impedances are different, frequency dependent and can be closely approximated by simple RC networks. A good compromise between these 4 impedances which can be used as the basis of ADSL/POTS separation filter design is given in FIG. 2, and in this document it is called Zm.

SUMMARY OF THE INVENTION

The present invention provides a telecommunications station comprising

- a line port connected to a transmission path having a frequency dependent characteristic impedance;
- a high-pass filter connected between the line port and means for transmitting and/or receiving signals in an upper frequency band;
- a low-pass filter arrangement connected between the line port and telephony apparatus for communication in a lower frequency band;
- wherein the low-pass filter arrangement comprises a passive filter and impedance conversion arrangement connected between the filter and the transmission path;
- each impedance conversion arrangement being substantially transparent to dc and to components exceeding a predetermined amplitude.

In another aspect the invention provides an impedance converter having first and second ports, an amplifier for receiving the voltage at the first port and a transformer coupling the output of the amplifier between the ports such that the voltage at the second port is a predetermined function of that at the first, and the current at the two ports is the same.

In a further aspect the invention provides an impedance converter having first and second ports, a current transformer connected between the ports, an amplifier for receiving current from the transformer, and to draw or deliver current to one of the ports as a function of the received current, such that the current at the second port is a predetermined function of that at the first and the voltage at the two ports is the same.

DESCRIPTION OF THE EXEMPLARY EMBODIMENTS

Some embodiments of the invention will now be described by way of example with reference to the accompanying drawings.

Figure 1:
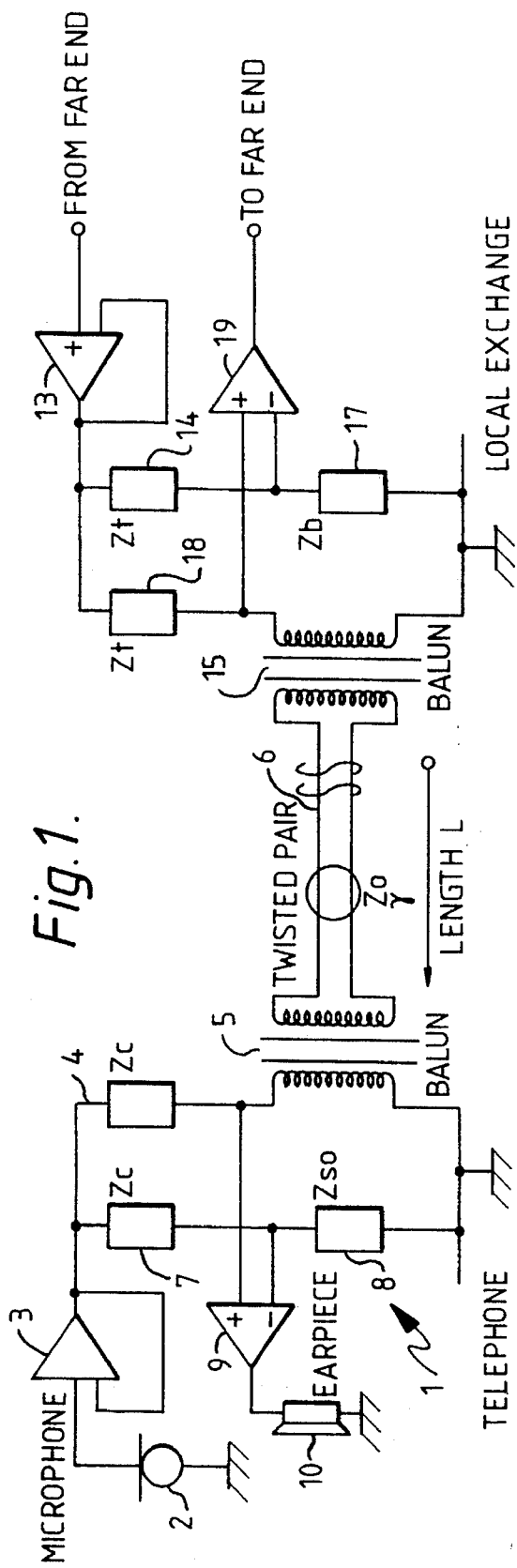
FIG. 1 illustrates an access network transmission model.
Figure 3:
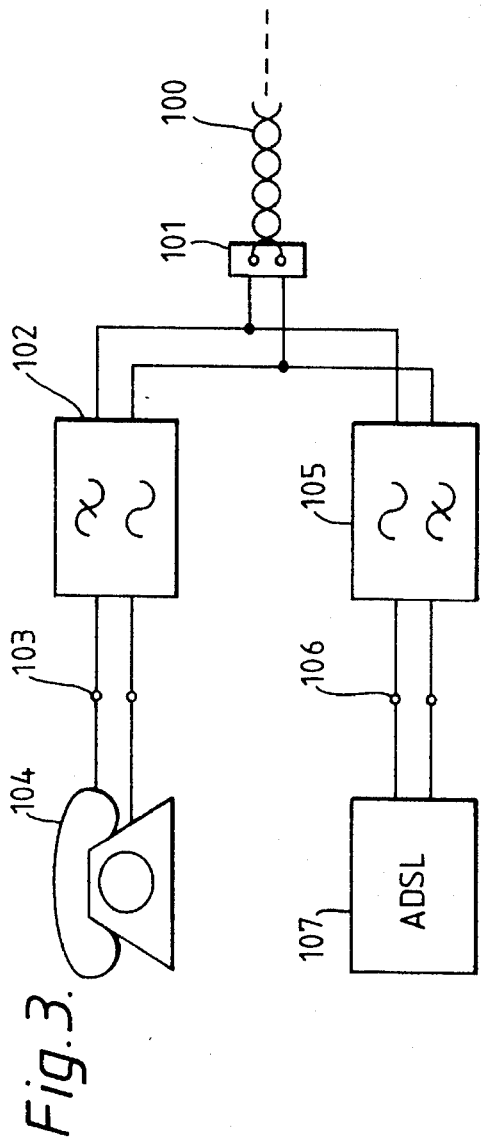
FIG. 3 illustrates filtering at the customer premises.

FIG. 3 shows the basic structure of separation filtering at the customer premises. A twisted pair line 100 from the local exchange (not shown) is connected to a line termination point 101. Two filters are connected in parallel to this point, namely a low-pass filter 102, connected via a telephone port 103, to a conventional telephone 104, and a high-pass filter 105 connected to an ADSL port 106 and hence to ADSL equipment 107.

The two filters have non-overlapping pass-bands so that, on the path from the telephone 104 to the ADSL equipment 107, transient energy from the telephone is attenuated at all frequencies from DC up to the region of 1 MHz. Ideally, each filter is nearly lossless in its passband, with a high degree of rejection (typically 100 dB or more) in the stopband. As they are connected in parallel, the filters need to have a high impedance (open circuit) at stopband frequencies. (An alternative configuration is a series connection, requiring low impedance in the stopband).

The lowpass filter needs a passband from d.c. to about 4 kHz, and is subject to two particular sets of requirements. Firstly it needs to be transparent to passage of ringing and line power from the line 100 to the telephone 104. As discussed earlier, it needs to be able to handle high-voltage transients without difficulty. (Also it should have virtually no impact on the operation of conventional line systems, thus requiring low leakage and low capacitance). Secondly the filter impedance characteristics need to be such that bridge balance of (unmodified) Telephones and exchange equipment is unaffected. Ideally this means that the characteristic impedance is the same as that of the line 100—i.e. Zm.

The characteristic impedance of a filter is that value of load impedance to the filter which minimises the frequency dependence of the impedance looking into the filter input. For a ripple-free (i.e. lossless) filter this is the same as defining the characteristic impedance so that load impedance which results in the same value of impedance looking into the filter input (as with a transmission line).

These two requirements are mutually conflicting the first requirement is difficult to meet using active filters, because of the problem of passing dc and the presence of large voltages such as ringing current and power feeding. It is undesirable to process these signals using operational amplifier circuits because of the large voltages involved. Also there is a need to maintain dielectric isolation between the wires of the pair and between each wire and ground both for safety reasons and to minimise problems with network test equipment which might otherwise report a fault on the line. Further there is a need to maintain very good linearity in the circuit because distortion, particularly of the ADSL signal, would seriously compromise system performance.

The second requirement cannot be met with passive filters since these have a real (resistive) characteristic impedance whilst the characteristic impedance of the transmission line 100 is—as discussed in the introduction—strongly frequency dependent.

Figure 4:
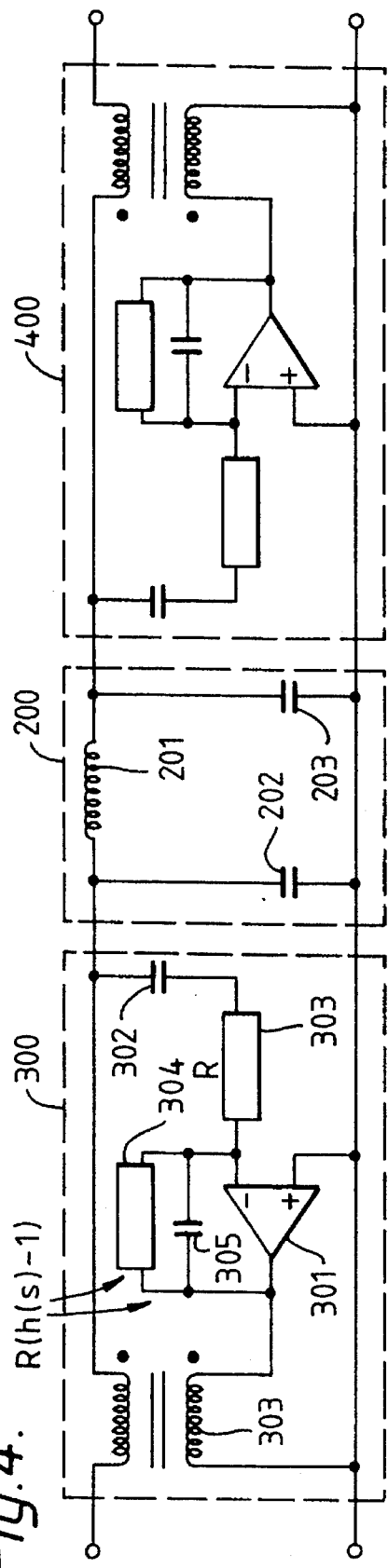
FIG. 4 shows one filter arrangement of the invention, a low-pass filter embedded in the VGICs.

FIG. 4 shows one example of a filter arrangement as envisaged by the invention. It comprises a passive filter 200, shown here as a simple pi filter with an inductor 201 and capacitors 202, 203, although a higher order filter would be needed (as discussed below) to attain the sort of rejection levels discussed earlier. The passive filter provides the desired performance for large signals but does not meet the impedance requirement. However both the input and output of the filter 200 are connected inside back-to-back pair of Generalised Immittance Converters (GIC), 300, 400. (The terms "input" and "output" are used here for convenience, but of course the filter arrangement passes signals in both directions).

The GIC is a two port device which acts to transform the impedance between the filter and the external circuitry connected to it. It behaves rather like a transformer but instead of multiplying the impedance by a real factor it changes it by any desired transfer function h(s).

There are a number of different designs of GIC; in particular the voltage GIC modifies the voltage between the two ports whilst leaving the current unchanged, whilst in a current GIC the reverse is true. The GIC 300 used in FIG. 4 is a voltage GIC of unconventional construction in which a high-gain inverting amplifier 301 receives (via a dc blocking capacitor 302 and resistor (value R) 303 the voltage at the right-hand port. The amplifier has a negative feedback path of impedance R (h(s)−1) and its output is connected via a transformer 303 between left and right-hand ports.

Figure 2:
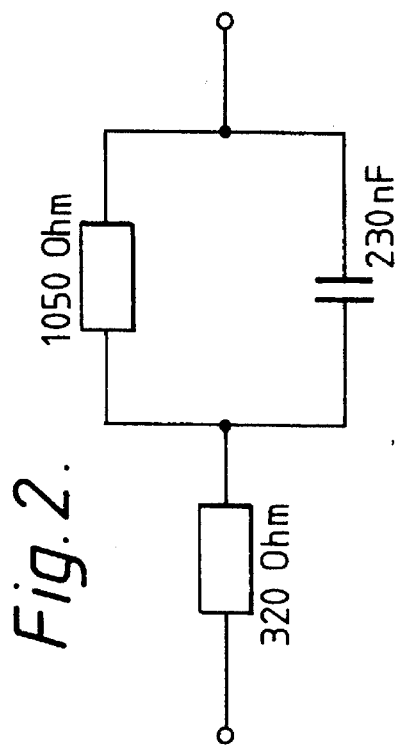
FIG. 2 illustrates the reference impedance Zm.

The impedance seen looking into the left-hand port of the GIC 300 is h(s) times the impedance seen looking into the left-hand side of the filter 200. Thus if (for example) the filter 200 has a characteristic impedance $Z_0$=320 Ω and is to be matched to the reference impedance Zm, then h(s) needs to be chosen such that Zm=320 h(s). Thus h(s)−1 =(Zm −320)/320. Reference to FIG. 2 shows that Zm−320 is just a parallel RC circuit and thus the feedback impedance in FIG. 4 is too, viz a resistor 304 and capacitor 305. The GIC 400 is identical to the GIC 300 This is however not always essential; indeed in a situation where the telephone is not well matched to the transmission line the balance may be improved by deliberately providing different GIC's so that the GIC 300 provides good matching between the telephone and the filter and the GIC 400 provides a good match between the filter and the line.

It is observed that this particular construction of the GIC, with the transformer 303 and the blocking capacitor 302, is such that dc components are unaffected by it; in particular line power and ringing current can pass unimpeded. Large transients can pass, simply causing saturation of the amplifier (the input and/or output of the amplifier can be provided with clamping diodes if necessary).

In an alternative arrangement, a current GIC would employ a current transformer to sense the line current, and an amplifier (with the desired transfer function) having a current (i.e. high impedance) output to drive a corresponding current into/from the line.

For clarity, the filter arrangement of FIG. 4 is ground referenced, but a balanced filter can be readily constructed, as will shortly be described. First, however, an unbalanced 7th order passive filter is shown for reference in FIG. 5. It is a modified elliptic filter with only two pairs of transmission zeros. It has inductors L4, L5, (with capacitors C5, C7) L8, and shunt capacitors C4, C6, C8 and C11. Note that the inductor L8 has no capacitor in parallel, to prevent loading of the high-pass filter in the low-pass filter stopband.

Figure 6:
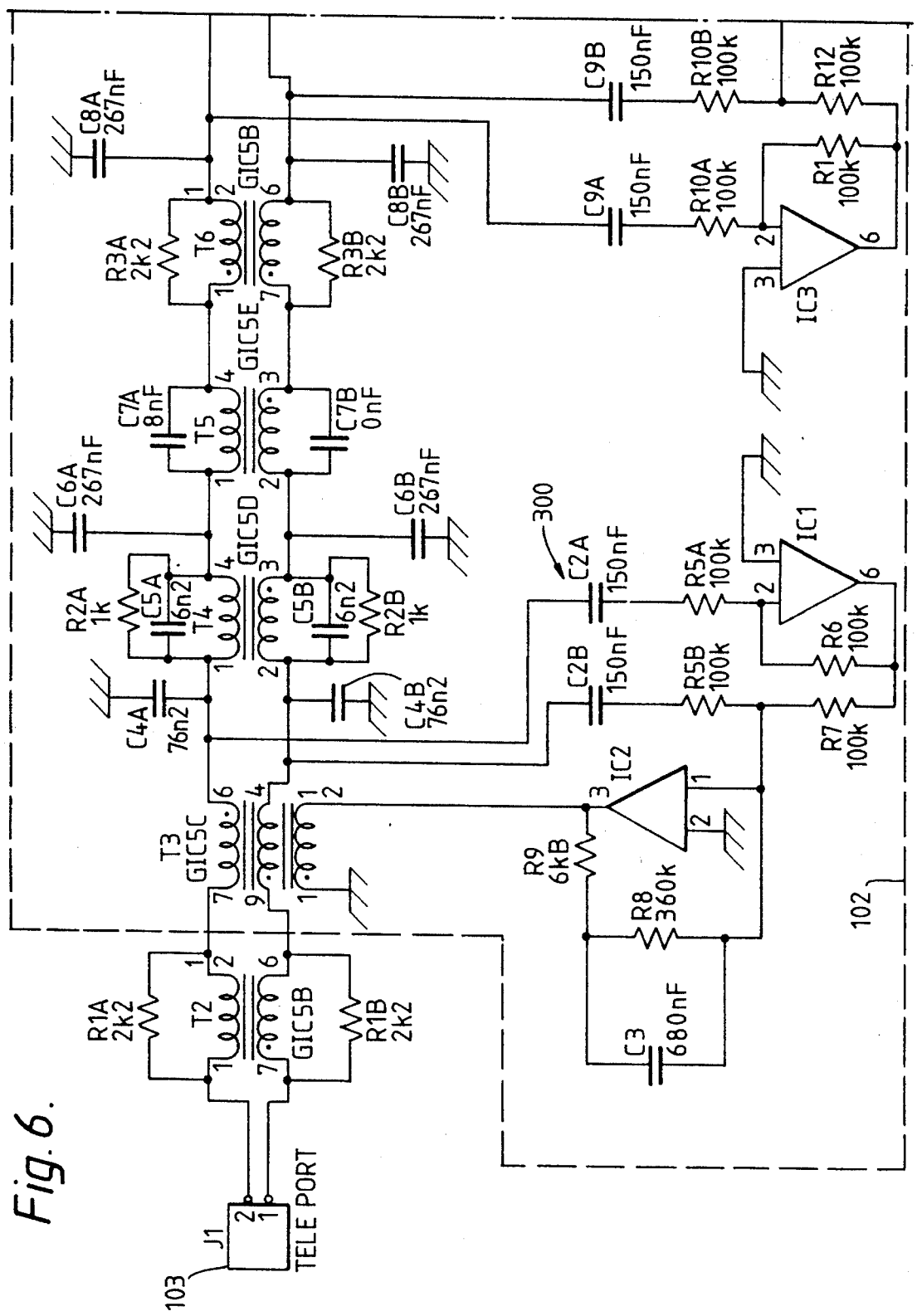
FIGS. 6 band 6A show a balanced filter arrangement.
Figure 6A:
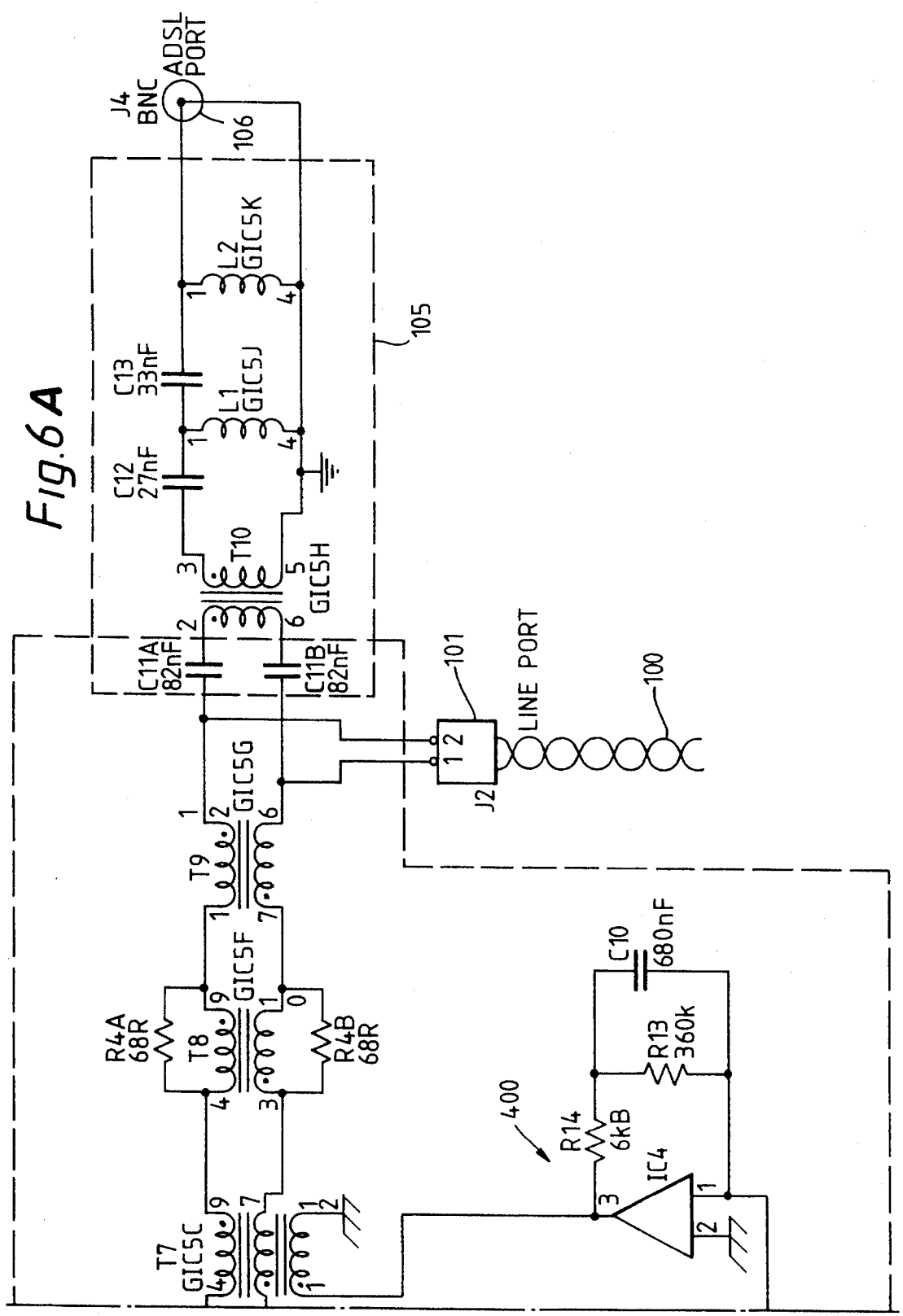

FIGS. 6 and 6A show a practical, balanced, embodiment. The line 100 and line port 101 are again shown, as are the telephone port 103, high-pass filter 105 and ADSL port 106. Firstly it should be noted that a common-mode filtering choke T2 and associated resistors R1A, R1B between the telephone port 103 and the low-pass filter 102, and a second common mode filtering choke T6 with resistors R3A, R3B play no part in the filtering (note that the phasing of the windings of these differs from that of the remaining transformers with the low-pass filter 102).

Figure 5:
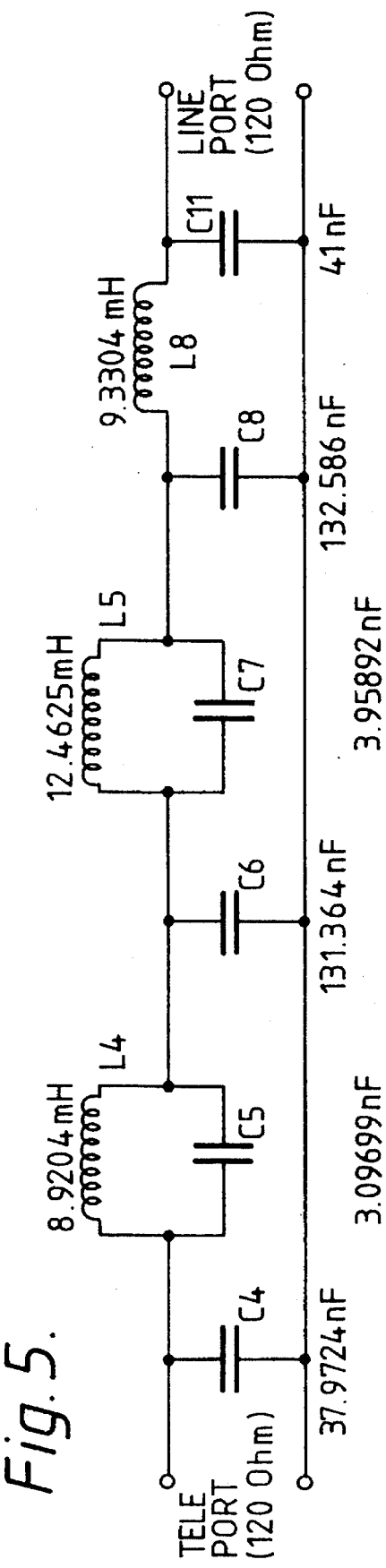
FIG. 5 shows a modified elliptic filter or scaled low-pass prototype filter.

The capacitors C4, C6 and C8 of FIG. 5 are replaced by centre-tapped series pairs C4A, C4B etc; similarly C5 and C7 are replaced by pairs C5A, C5B, C7A, C7B. The functions of inductors L4, L5 are performed by transformers T4, T5 in a balanced arrangement.

As before there are two generalised immittance converters, the first, 300' receives balanced signals from C4A, C4B via dc blocking capacitors C2A, C2B. One signal is inverted by an amplifier IC1 with resistors R5A, R6, and the two signals summed via R5B, R7 into the input of a second amplifier IC2 whose h(s)-1 negative feed back path is provided by C3, R8 and R9. The transformer 303 is represented by transformer T3 with three windings phased as shown. The GIC 400' is identical to the GIC 300'.

The inductor L8 is represented by two transformers T8 and T9, the former with parallel resistors R4A, R4B outside the GIC's. This could be between the GIC's as a single transformer without resistance, but is placed outside to reduce the amount of high frequency ADSL signal received by the GIC itself. T8, T9, R4A and R4B represent an appropriately transformed version of the required inductance. The capacitor C11 is replaced by capacitor C11A, C11B in series (transformer C10 of the high-pass filter representing a short circuit at telephony frequencies). This capacitor is also outside the GIC's. Properly C11 should also undergo a transformation but this is not done for two reasons. C11 is also part of the high-pass filter and so cannot be transformed without side effects but the main problem is that the direct transformation of a capacitor requires an Frequency Dependent Negative Resistor (FDNR) which is unrealisable without further active elements. As this would be too exposed to the ADSL signal, and would cause linearity and noise problems, it is not done.

Resistors R2A, R2B (though not part of the prototype filter of FIG. 5) are included to damp the parallel resonance of T4 and C5. This damping ensures stability of the active filter in the stopband when the filter is adversely terminated (including short and open-circuits).

Other sources of in-band loss are the resistances of the wound components and the failure to provide the correct transformation of the capacitor C11.

The high-pass filter 105 shares the capacitors C11A, C11B and also has a balun transformer T10 which also forms the first shunt inductor of the high-pass filter, which additionally includes further series capacitors C12, C13 and shunt inductors L10, L20.

Figure 7:
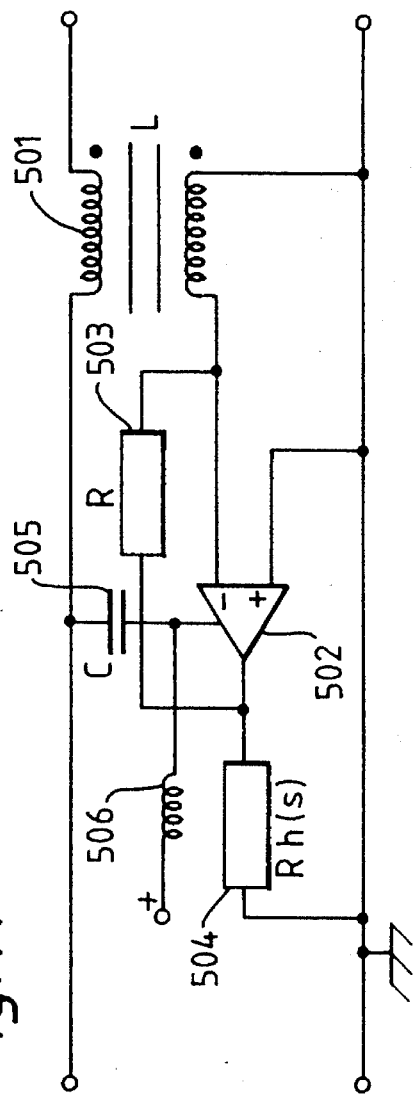
FIG. 7 shows a current impedance converter or a dielectrically isolated IGIC.

FIG. 7 shows a current GIC; here the current i1 at the right-hand port is sensed by a current transformer 501. This is converted into a current (h(s)-1) times as large by an amplifier 502 with a feedback resistor 503 of resistance R and a complex load impedance 504 of impedance R/(h(s)-1). The resulting current $i_1(h(s)-1)$ is coupled into the left-hand port by coupling the power rail of the amplifier 502 to it in a d.c. blocking capacitor 505, so that the total current at the left-hand port is $i_1.h(s)$. The power rail of the amplifier is fed with power via a choke 506.

I claim:

1. A telecommunications station comprising:
    a line port connected to a transmission line having a frequency dependent characteristic impedance;
    a high-pass filter connected between the line port and means for transmitting and/or receiving signals in an upper frequency band;
    a low-pass filter arrangement connected between the line port and telephony apparatus for communication in a lower frequency band;
    wherein the low-pass filter arrangement comprises a passive filter and an impedance conversion arrangement having two ports connected respectively to the passive filter and to the transmission line;
    the impedance conversion arrangement comprising a conductive path between the two ports so as to be substantially transparent to d.c. and to pulse and ringing components exceeding a predetermined amplitude, and an amplifier connected to receive signals from the conductive path and to deliver to the conductive path a current or a voltage that is a frequency-dependent function of the received signals.

2. A telecommunications station according to claim 1, in which the impedance conversion arrangement has a transfer function such that the characteristic impedance of the filter is at least approximately matched to the characteristic impedance of the transmission line.

3. A telecommunications station according to claim 1 including a second such impedance conversion arrangement connected between the passive filter and the telephony apparatus.

4. A telecommunications station according to claim 1, in which the transmission line is a twisted-pair line.

5. A telecommunications station according to claim 1 in which the amplifier is connected to receive a voltage at a first one of the two ports, and to deliver the frequency-dependent function of this voltage to the primary winding of a transformer, and wherein a secondary winding of the transformer is connected into the conductive path between the two ports such that the voltage at the second of the two ports is a predetermined function of that at the first port and the current at the two ports is the same.

6. A telecommunications station according to claim 5 for connection to a balanced line, in which first and second terminals of the first port are connected by first and second transformer secondary windings to first and second terminals of the second port.

7. A telecommunications station according to claim 1 wherein a primary winding of a transformer is connected into the conductive path between the two ports to sense the current therein, and the amplifier is connected to receive the output of the transformer and to draw current from, or deliver current to, one of the ports as a frequency-dependent function of the sensed current, such that the current at the second port is a predetermined function of that at the first port and the voltage at the two ports is the same.

8. A filter for connection to a source or load having a frequency-dependent impedance, comprising a passive filter and an impedance conversion arrangement having two ports of which one is connected to the filter and the other is for connection to a source or load;
    the impedance conversion arrangement comprising a conductive path between the two ports so as to be substantially transparent to d.c. and to pulse and ringing components exceeding a predetermined amplitude, and an amplifier connected to receive signals from the conductive path and to deliver to the conductive path a current or a voltage that is a frequency-dependent function of the received signals.

* * * * *